(12) United States Patent
Horibe et al.

(10) Patent No.: US 9,373,545 B2
(45) Date of Patent: Jun. 21, 2016

(54) SEMICONDUCTOR STRUCTURE INCLUDING A THROUGH ELECTRODE, AND METHOD FOR FORMING THE SAME

(71) Applicant: International Business Machines Corporation, Armonk, NY (US)

(72) Inventors: Akihiro Horibe, Kawasaki (JP);
Hiroyuki Mori, Kawasaki (JP);
Yasumitsu Orii, Kawasaki (JP);
Kuniaki Sueoka, Kawasaki (JP);
Kazushige Toriyama, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/967,640

(22) Filed: Dec. 14, 2015

(65) Prior Publication Data

US 2016/0099175 A1 Apr. 7, 2016

Related U.S. Application Data

(63) Continuation of application No. 14/833,368, filed on Aug. 24, 2015.

(30) Foreign Application Priority Data

Aug. 25, 2014 (JP) ................................ 2014-171019

(51) Int. Cl.
*H01L 21/48* (2006.01)
*H01L 23/48* (2006.01)
*H01L 23/522* (2006.01)
(Continued)

(52) U.S. Cl.
CPC ........ *H01L 21/76898* (2013.01); *H01L 21/486* (2013.01); *H01L 21/76802* (2013.01);
(Continued)

(58) Field of Classification Search
CPC .............. H01L 21/4863; H01L 23/481; H01L 23/5226
See application file for complete search history.

(56) References Cited

U.S. PATENT DOCUMENTS

| 9,041,163 B2 * | 5/2015 | Chen ................. H01L 21/76898 257/621 |
| 2011/0207323 A1 * | 8/2011 | Ditizio ................ B81C 1/00087 438/675 |
| 2015/0028494 A1 * | 1/2015 | Park ..................... H01L 23/481 257/774 |

OTHER PUBLICATIONS

Akihiro Horibe et al., Pending U.S. Appl. No. 14/833,368 entitled "Semiconductor Structure Including a Through Electrode, and Method for Forming the Same," filed with the USPTO on Aug. 24, 2015.

(Continued)

*Primary Examiner* — Karen Kusumakar
(74) *Attorney, Agent, or Firm* — Cantor Colburn LLP; Keivan Razavi

(57) ABSTRACT

A semiconductor structure including a through electrode includes a lamination body including at least three layers, including respective vertically aligned electrode parts, the electrode part on the surface of an uppermost layer and including an aperture, the electrode part of the intermediate layer having an aperture smaller than the aperture of the uppermost layer; a through-hole extending from the aperture of the electrode part on the uppermost layer to the surface of the electrode part on a lowermost layer, the through-hole having a depressed part on a side wall thereof between the electrode parts therein; an insulating layer disposed on the entire side wall in the through-hole at a part other than on surfaces of the electrode parts; and a conductive material filling the through-hole from the surface of the electrode part on the lowermost layer to the surface of the electrode part on the uppermost layer.

6 Claims, 6 Drawing Sheets

(51) Int. Cl.
*H01L 21/768* (2006.01)
*H01L 25/00* (2006.01)

(52) U.S. Cl.
CPC .... *H01L21/76831* (2013.01); *H01L 21/76871* (2013.01); *H01L 21/76879* (2013.01); *H01L 23/481* (2013.01); *H01L 23/5226* (2013.01); *H01L 25/50* (2013.01)

(56) References Cited

OTHER PUBLICATIONS

List of IBM Patents or Patent Applictions Treated As Related; (Appendix P), Filed Feb. 1, 2016, 2 pages.

* cited by examiner

SEMICONDUCTOR STRUCTURE INCLUDING A THROUGH ELECTRODE, AND METHOD FOR FORMING THE SAME

DOMESTIC AND FOREIGN PRIORITY

This application is a continuation of U.S. patent application Ser. No. 14/833,368, filed Aug. 24, 2015, which claims priority to Japanese Patent Application No. 2014-171019, filed Aug. 25, 2014, and all the benefits accruing therefrom under 35 U.S.C. §119, the contents of which in its entirety are herein incorporated by reference.

BACKGROUND

The present invention relates to semiconductor structures, and more particularly relates to a stacked semiconductor structure including a through electrode and a method for forming a through electrode in such a semiconductor structure.

Three-dimensional integration of semiconductor devices is an important technique to break though the barrier to improve the performance with two-dimensional scaling so far. Conventional integration schemes, however, have cost issues in this regard, and so three-dimensional integration is not currently widespread. One of these problems results from the cost required for the formation and the connection of conductors for vertical electrical connection. For future expanded use of the three-dimensional integration, a process for integration at low cost has to be developed.

Japanese Patent Application Publication Nos. 2011-159889 and 2014-57065 both disclose a semiconductor device of a multi-layered structure including a through silicon via (TSV). Methods for manufacturing the semiconductor devices disclosed in these documents, however, are to joint substrates (layers) each having a TSV formed therein beforehand to couple their TSVs, and so the number of processes to form and connect conductors for vertical electrical connection increases, meaning an increase in cost.

SUMMARY

In one embodiment, a semiconductor structure including a through electrode includes a lamination body including at least three layers, the layers including respective electrode parts that are aligned vertically, the electrode part of an uppermost layer of the lamination body being on the surface of the uppermost layer and including an aperture, the electrode part of the intermediate layer having an aperture that is smaller than the aperture of the uppermost layer; a through-hole extending from the aperture of the electrode part on the uppermost layer to the surface of the electrode part on a lowermost layer of the lamination body, the through-hole having a depressed part on a side wall thereof at a part between the electrode parts therein; an insulating layer disposed on the entire side wall in the through-hole at a part other than on surfaces of the electrode parts; and a conductive material, with which the through-hole is filled from the surface of the electrode part on the lowermost layer to the surface of the electrode part on the uppermost layer.

In another embodiment, a method for forming a through electrode in a semiconductor structure includes preparing a semiconductor structure including at least three stacked layers, the layers including respective electrode parts that are aligned vertically, the electrode part of an uppermost layer being on the surface of the uppermost layer and including an aperture, and the electrode part of an intermediate layer having an aperture that is smaller than the aperture of the electrode part of the uppermost layer; forming a through-hole by anisotropic etching using a mask to expose the electrode part of the uppermost layer only of the semiconductor structure, the through-hole extending from the aperture of the electrode part of the uppermost layer to the surface of the electrode part of a lowermost layer; applying isotropic etching to the through-hole to form a depressed part on a side wall in the through-hole between the electrode parts; forming an insulating layer on the side wall in the through-hole on which the depressed part has been formed; applying anisotropic etching to the through-hole with the insulating layer formed therein, thus exposing the surfaces of the electrode parts in the through-hole; and filling the through-hole in which the surfaces of the electrode parts are exposed with a conductive material.

DETAILED DESCRIPTION

Figure 1:
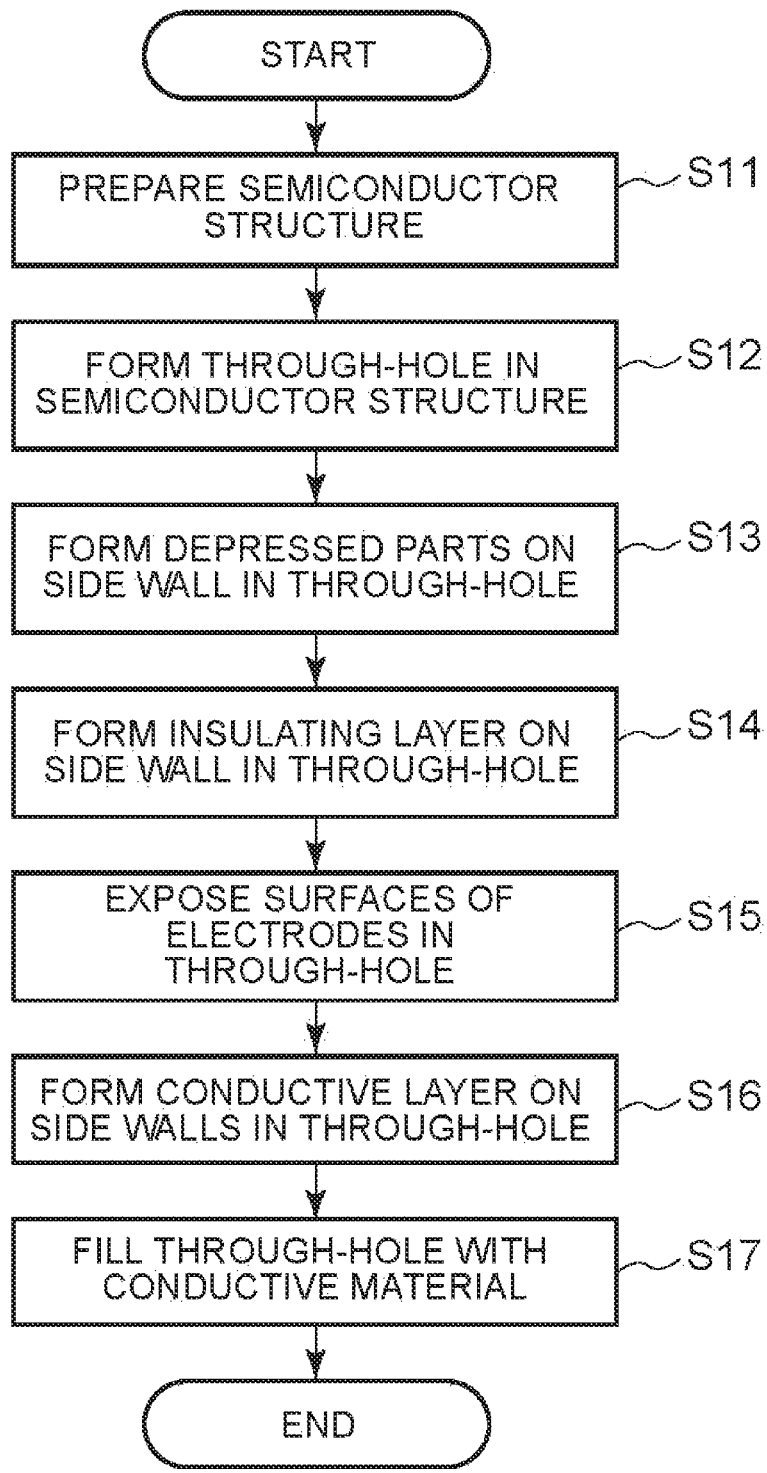
FIG. 1 is a flowchart of a method according to an embodiment of the present invention.

In view of the problems described above, there is a need to provide a vertical electrical connection structure at low cost for a stacked semiconductor structure, and particularly to provide a vertical electrical connection structure that can be manufactured with a less number of processes and at low cost.

One aspect of the present invention provides a semiconductor structure including a through electrode. The semiconductor structure includes: a lamination body including at least three layers, the layers including respective electrode parts that are aligned vertically, the electrode part of the uppermost layer being on the surface of the uppermost layer and including an aperture, and the electrode part of the intermediate layer having an aperture that is smaller than the aperture of the uppermost layer; a through-hole extending from the aperture of the electrode part on the uppermost layer to the surface of the electrode part on the lowermost layer of the lamination body, the through-hole having a depressed part on a side wall thereof at a part between the electrode parts therein; an insulating layer disposed on the entire side wall in the through-hole at a part other than on surfaces of the electrode parts; and a conductive material, with which the through-hole is filled from the surface of the electrode part on the lowermost layer to the surface of the electrode part on the uppermost layer.

According to the one aspect of the present invention, since the side wall between the electrode parts in the through-hole that are aligned vertically in the lamination body have the depressed parts, the surfaces (side wall) of the electrode parts in the through-hole overhang such depressed parts, thus securing electrical connection between the conductive material in the through-hole and the electrode parts. As a result, vertical electrical connectivity between the layers via the through-electrode can be improved even in a deep through-hole (through-electrode).

Another aspect of the present invention provides a method for forming a through electrode in a semiconductor structure. The method includes: preparing a semiconductor structure including at least three layers stacked, the layers including respective electrode parts that are aligned vertically, the electrode part of the uppermost layer being on the surface of the uppermost layer and including an aperture, and the electrode part of the intermediate layer having an aperture that is smaller than the aperture of the electrode part of the uppermost layer; forming a through-hole by anisotropic etching using a mask to expose the electrode part of the uppermost layer only of the semiconductor structure, the through-hole extending from the aperture of the electrode part of the uppermost layer to the surface of the electrode part of the lowermost layer; applying isotropic etching to the through-hole so as to form a depressed part on a side wall in the through-hole between the electrode parts; forming an insulating layer on the side wall in the through-hole on which the depressed part is formed; applying anisotropic etching to the through-hole with the insulating layer formed therein, thus exposing the surfaces of the electrode parts in the through-hole; and filling the through-hole in which the surfaces of the electrode parts are exposed with a conductive material.

According to another aspect of the present invention, the through-hole is formed at one process at the electrode parts that are aligned vertically in the lamination body, and the through-hole is filled with a conductive material for electrical connection to the electrode parts for the formation of the through electrode. In this way, the vertical electric connection structure can be obtained with a less number of processes. Since the electrode parts are used as one hard mask, process margin for anisotropic etching at the through-hole can be improved. Then, isotropic etching is performed after the anisotropic etching of the through-hole, which is for etching the side wall (surfaces) between the electrode parts in an overhang (depressed) shape, on which the insulating layer is then deposited, whereby process margin for subsequent anisotropic etching to expose the surface (side wall) of the electrode parts can be improved.

Figure 8:
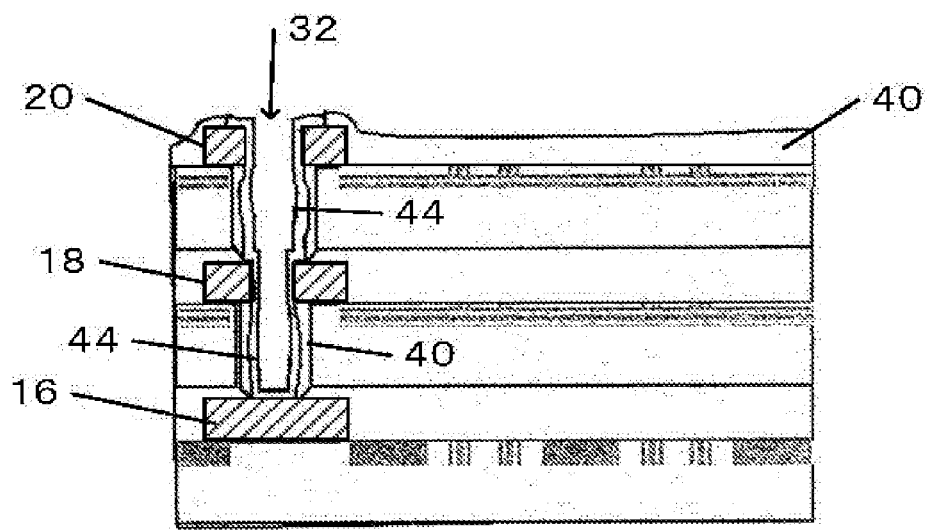
FIG. 8 is a cross-sectional view of a process in the method according to the present invention.
Figure 9:
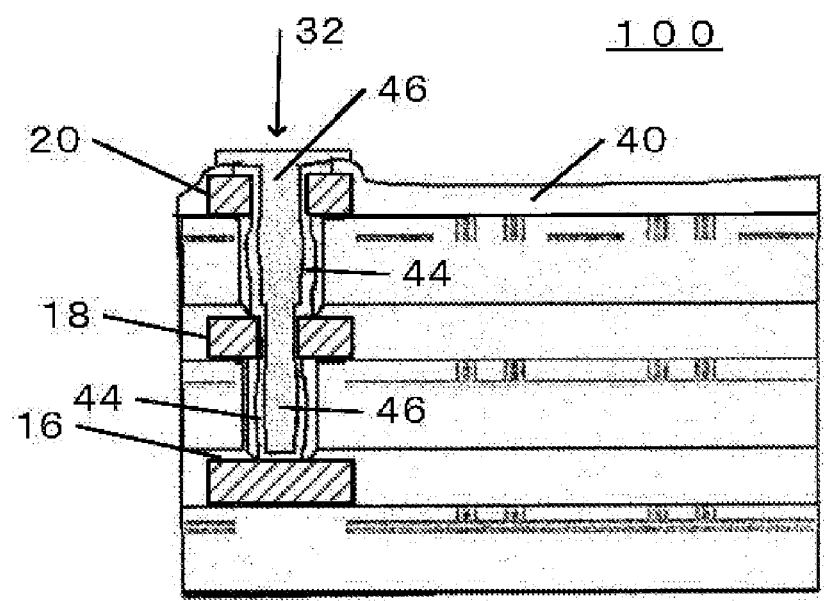
FIG. 9 is a cross-sectional view of a process in the method according to the present invention.
Figure 10:
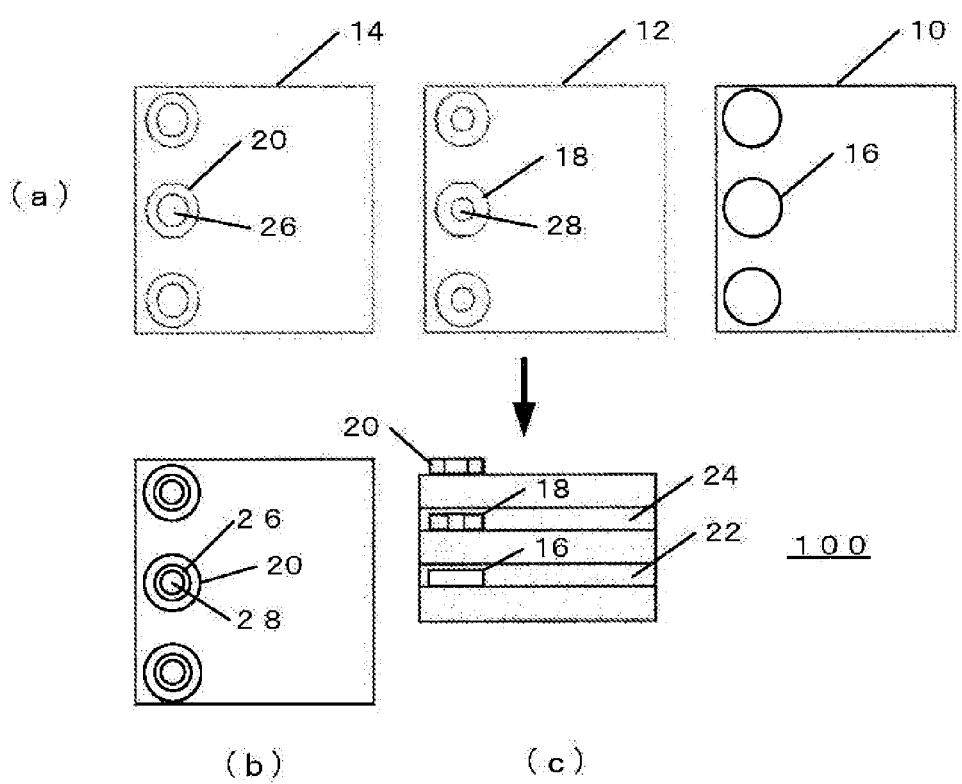
FIG. 10 describes the process of FIG. 2.

The following describes embodiments of the present invention, with reference to the drawings. FIG. 1 is a flowchart of a method according to the present invention. FIGS. 2 to 9 are cross-sectional views of the processes in the method according to the present invention. FIG. 10 describes the process of FIG. 2. Although the following describes the formation of one semiconductor structure by stacking three semiconductor substrates, the semiconductor structure to which the method of the present invention is applicable is not limited to this mode, which may include any number of three or more semiconductor substrates or equivalent wiring boards (circuit boards) or the like.

Figure 2:
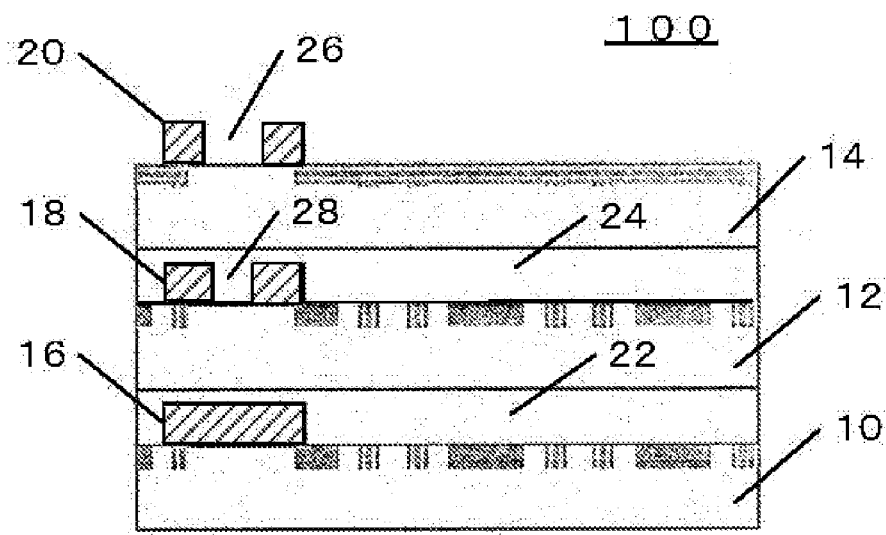
FIG. 2 is a cross-sectional view of a process in the method according to an embodiment of the present invention.

At operation S11 of FIG. 1, a semiconductor structure including at least three layers stacked is prepared. As illustrated in FIG. 2, a semiconductor structure 100 includes the lamination of three semiconductor substrates 10, 12 and 14 via organic materials 22 and 24. The semiconductor structure 100 may be used as part in the semiconductor device including ICs, etc. The semiconductor substrates may be made of any semiconductor material, such as silicon. In the present invention, the semiconductor material is not limited to specific types. Each of the semiconductor substrates may include a plurality of wiring layers (including devices such as a transistor) and an insulating layer.

The semiconductor substrates include, on their surfaces, electrode parts 16, 18 and 20, respectively, that are aligned vertically. The electrode part 20 on the uppermost layer includes an aperture 26 on its surface. The electrode part 18 on the intermediate layer includes an aperture 28 that is smaller than the aperture 26 of the electrode part 20 on the uppermost layer. Although FIG. 2 shows only one set of the electrodes 16, 18 and 20, a plurality of similar sets of (structured) electrode parts may be disposed at any other positions. The same applies to FIGS. 3 to 9.

View (a) in FIG. 10 includes top views of the three semiconductor substrates 10, 12 and 14 before stacking. Views (b) and (c) in FIG. 10 are a top view and a cross-sectional view, respectively of the three semiconductor substrates 10, 12 and 14 after stacking, i.e., of the semiconductor structure 100. As illustrated in view (a), the semiconductor substrates 10, 12 and 14 are provided with the electrode parts 16, 18 and 20 of a circular shape on their surfaces. The electrode part 16 is made of a solid conductive material. The electrode parts 18 and 20 have the apertures 28 and 26 in the circular conductive material. The conductive material used may be any metallic material that can be used for semiconductor substrates, such as Cu and Ni. The method of the present invention is not limited to specific conductive materials of the electrode parts 16, 18 and 20, and any conductive material (metallic material) can be used.

The size (inner diameter) of the aperture 26 is larger than the size (inner diameter) of the aperture 28. As illustrated in view (b), the three semiconductor substrates 10, 12 and 14 are aligned so that their electrode parts 16, 18 and 20 are overlapped vertically, followed by bonding via the organic materials 22 and 24 as illustrated in view (c). The organic materials 22 and 24 used may be thermosetting resin (polymer material), for example. They may be bonded by a conventional bonding method for semiconductor wafers, for example. The method of the present invention is not limited to any specific bonding method.

Figure 3:
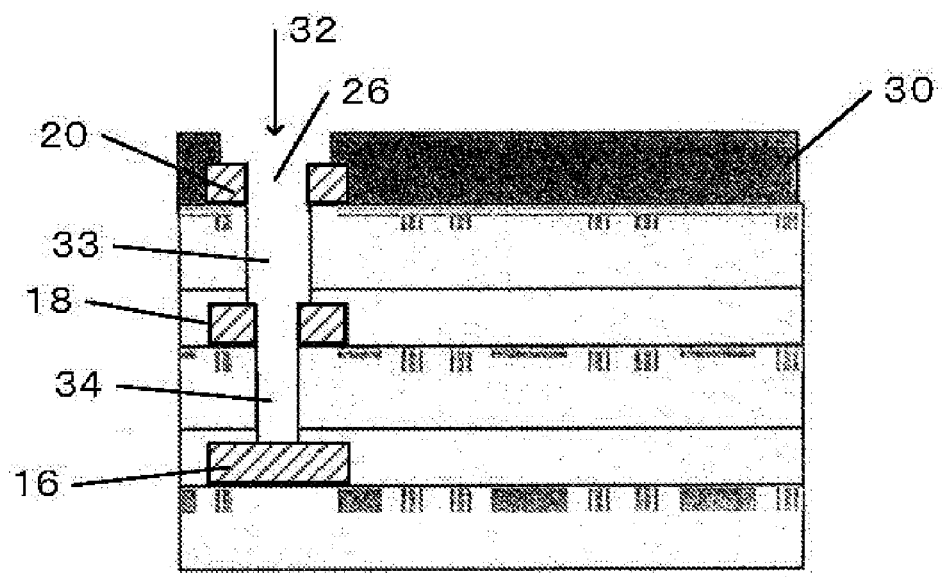
FIG. 3 is a cross-sectional view of a process in the method according to the present invention.

At operation S12 of FIG. 1, a through-hole is formed in the semiconductor structure. As illustrated in FIG. 3, a mask 30 is placed to expose the electrode part 20 on the uppermost layer only of the semiconductor structure 100, and a through-hole 32 is formed by anisotropic etching, the through-hole extending from the aperture 26 of the electrode part 20 on the uppermost layer to the surface of the electrode part 16 on the lowermost layer. The anisotropic etching may be induction coupled plasma (ICP) etching or ion milling using an ion beam, for example. The "through-hole (hole)" in the present invention refers to penetration through at least two layers of the semiconductor substrates stacked in the semiconductor structure 100. For instance, in the example of FIG. 3, the through-hole 32 penetrates through the semiconductor substrates 12 and 14.

During this anisotropic etching, the uppermost electrode part 20 (the aperture 26 thereof) functions as a one hard mask to define the inner diameter of an aperture 33 located thereunder. Similarly, the intermediate electrode part 18 (the aperture 28 thereof) functions as one hard mask to define the inner diameter of an aperture 34 located thereunder. In this way, the electrode parts of the semiconductor structure function as one hard mask to form a through-hole, which is one of the features of the method according to the present invention.

Figure 4:
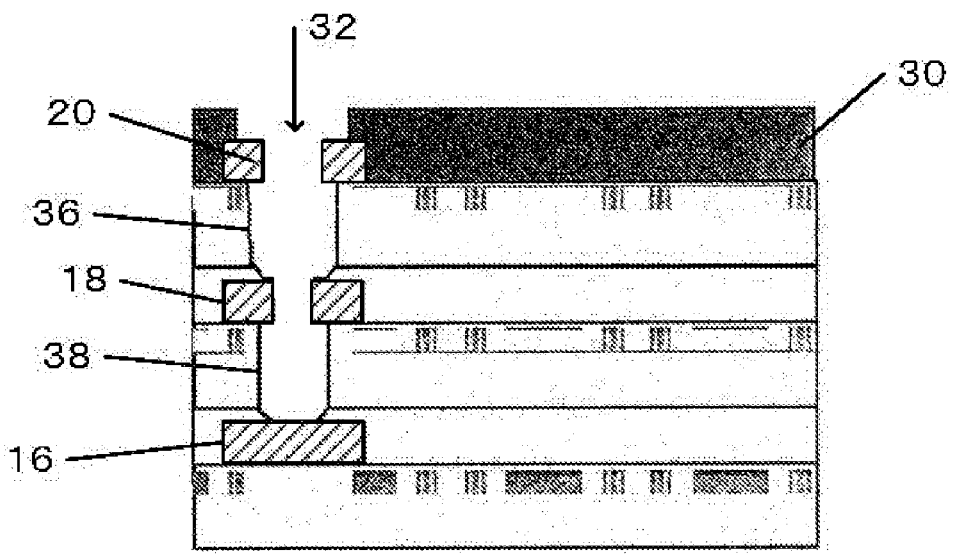
FIG. 4 is a cross-sectional view of a process in the method according to the present invention.

At operation S13 of FIG. 1, a depressed part is formed on the side wall in the through-hole. As illustrated in FIG. 4, isotropic etching is performed to the through-hole 32, thus forming depressed parts 36 and 38 on the side wall between the electrode parts 16, 18 and 20 in the through-hole. During this isotropic etching as well, the uppermost electrode part 20 (the aperture 26 thereof) and the intermediate electrode part 18 (the aperture 28 thereof) function as one hard mask for etching of the side wall between the electrodes. The thus formed depressed parts 36 and 38 allow the side wall of the electrode parts 20 and 18 to overhang the depressed parts 36 and 38.

Figure 5:
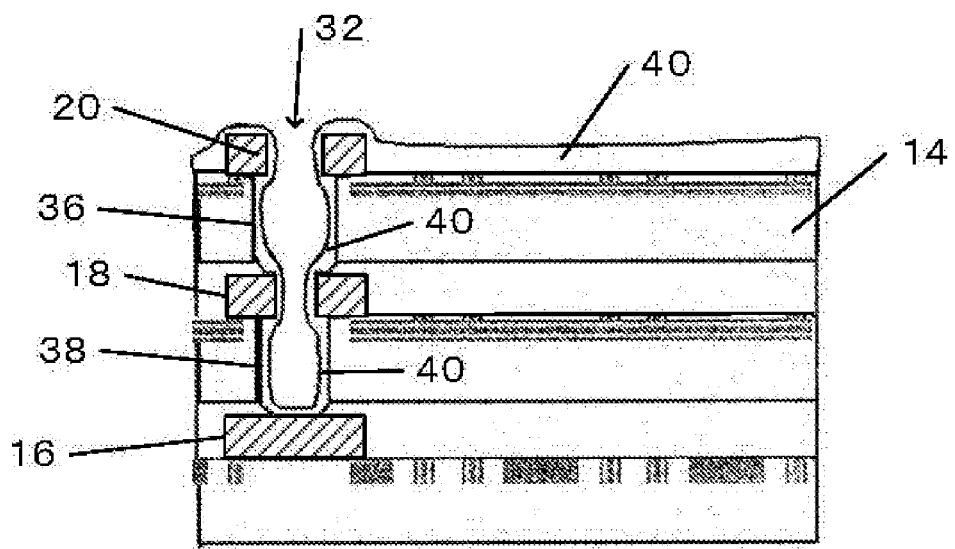
FIG. 5 is a cross-sectional view of a process in the method according to the present invention.

At operation S14 of FIG. 1, an insulating layer is formed on the side wall in the through-hole with the depressed parts formed thereon. As illustrated in FIG. 5, in the semiconductor structure after removal of the mask 30 of FIG. 4, an insulating layer 40 is formed on the side wall (depressed parts) 36, 38 and on the side wall of the electrodes 16, 18 and 20 in the through-hole 32 and on the uppermost surface of the semiconductor substrate 14. The insulating layer 40 can be obtained, for example, by forming a conformal organic polymerized layer (e.g., polyimide) using a surface reaction on the side wall 36, 38 in the through-hole 32. The insulating layer 40 may be made of a dielectric material (organic material) having a low dielectric constant (low-k) or low Young's modulus. This can improve the high-frequency characteristics of the through-electrode in the final product or can alleviate stress applied to the through-electrode.

Figure 6:
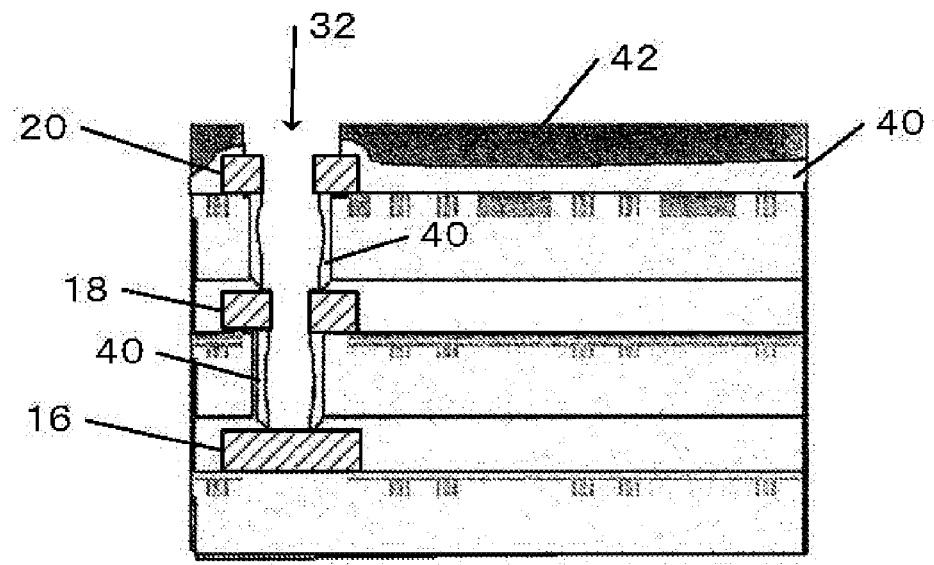
FIG. 6 is a cross-sectional view of a process in the method according to the present invention.

At operation S15 of FIG. 1, the electrodes in the through-hole are exposed at their surfaces (on the side wall). As illustrated in FIG. 6, a mask 42 is firstly formed on the insulating layer 40 on the surface, followed by anisotropic etching performed to the through-hole 32, thus exposing the surfaces of the electrode parts 16, 18 and 20 in the through-hole 32. The anisotropic etching may be performed similarly to the method at Step S12 as stated above. Since the side wall of the electrode parts 20 and 18 overhang at the previous Step S13 (FIG. 4), the insulating layer 40 at a part on the side wall (surfaces) of the electrode parts 20 and 18 can be preferentially (firstly) etched (removed) during this anisotropic etching. That is, the side wall (surfaces) of the electrode parts 20 and 18 can be exposed reliably while leaving the insulating layer 40 at a part between the electrode parts.

Figure 7:
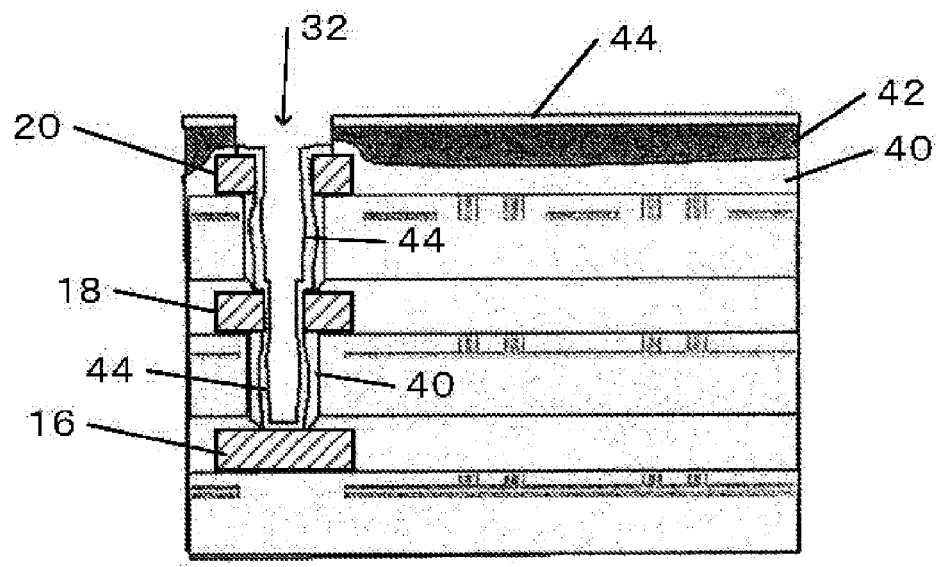
FIG. 7 is a cross-sectional view of a process in the method according to the present invention.

At operation S16 of FIG. 1, a barrier layer or a seed layer is formed on the side wall in the through-hole, and then a conductive layer is formed for better wettability at the surface in the through-hole. For instance, as illustrated in FIG. 7, a conductive layer 44 is formed to cover the surfaces of the electrode parts 16, 18 and 20 as well as the insulating layer 40 in the through-hole 32 and to cover the mask 42 on the surface. The conductive layer 44 can be formed by a conventional thin-film formation technique such as sputtering or plasma CVD, for example. The conductive layer 44 may be made of Cu or Ni, for example. The conductive layer 44 can be formed optionally for the embodiment of the present invention, which may be formed for enabling the following filling process of a conductive material to be performed smoothly, specifically for better wettability when a solder material is used as the conductive material, for example.

At operation S17 of FIG. 1, the through-hole is filled with a conductive material. As illustrated in FIG. 8, the conductive layer 44 on the surface as well as the mask 42 is removed firstly by so-called lift off process. Next, as illustrated in FIG. 9, the through-hole 32 is filled with a conductive material 46. The conductive material may be filled, for example, by filling the through-hole 32 with a solder material by Injection Mold Solder (IMS) method.

The solder material may include a Pb-free solder metal containing at least one metal selected from the group consisting of elemental Sn, Ag, Au, Cu, Ni, Bi, In, Zn, Co, Ge, Fe and Ti, and containing Sn or In as a main component. Instead of the solder material, other conductive materials having relatively high flowability may be used. The conductive material 46 in the through-hole 32 in FIG. 9 can implement a perpendicular (vertical) through-electrode that electrically connects to the exposed surfaces of the electrode parts 16, 18 and 20. The insulating layer 40 between the electrode parts 16, 18 and 20 can reliably prevent electrical short with the side wall of the semiconductor substrates at parts other than the electrode parts in the through-hole 32.

While the embodiments of the present invention are described in the above with reference to the drawings, the present invention is not limited to these embodiments. The present invention can be embodied in modes that are improved, modified or changed variously based on knowledge of those skilled in the art without deviating from the gist of the invention.

REFERENCE SIGNS LIST 10, 12, 14 semiconductor substrate
16, 18, 20 electrode part
20, 24 organic material (dielectric material, resin)
26, 28, 33, 34 aperture
30, 42 mask
32 through-hole
44 conductive layer
46 conductive material
100 semiconductor structure

The invention claimed is:

1. A method for forming a through electrode in a semiconductor structure, comprising:
   preparing a semiconductor structure including at least three stacked layers, the layers including respective electrode parts that are aligned vertically, the electrode part of an uppermost layer being on the surface of the uppermost layer and including an aperture, and the electrode part of an intermediate layer having an aperture that is smaller than the aperture of the electrode part of the uppermost layer;
   forming a through-hole by anisotropic etching using a mask to expose the electrode part of the uppermost layer only of the semiconductor structure, the through-hole extending from the aperture of the electrode part of the uppermost layer to the surface of the electrode part of a lowermost layer;
   applying isotropic etching to the through-hole to form a depressed part on a side wall in the through-hole between the electrode parts;
   forming an insulating layer on the side wall in the through-hole on which the depressed part has been formed;
   applying anisotropic etching to the through-hole with the insulating layer formed therein, thus exposing the surfaces of the electrode parts in the through-hole; and
   filling the through-hole in which the surfaces of the electrode parts are exposed with a conductive material.

2. The method according to claim 1, wherein preparing the semiconductor structure includes stacking of at least three semiconductor substrates via organic materials, wherein each of the electrode parts is disposed on the surface of the corresponding semiconductor substrate.

3. The method according to claim 1, further comprising, prior to filling the through-hole with a conductive material, forming a conductive layer to cover the surfaces of the electrode parts and the insulating layer in the through-hole.

4. The method according to claim 1, wherein forming an insulating layer on the side wall in the through-hole includes forming a conformal organic polymerized layer using a surface reaction on the side wall in the through-hole.

5. The method according to claim 1, wherein filling the through-hole with a conductive material includes filling the through-hole with a solder material by Injection Mold Solder (IMS).

6. The method according to claim 1, wherein forming the through-hole includes forming a through-hole extending to the surface of the electrode part of the lowermost layer while using the electrode parts having the apertures of the uppermost layer and the intermediate layer serving as a hard mask in the anisotropic etching.

\* \* \* \* \*